United States Patent
Zhou (12)

(10) Patent No.: US 8,704,318 B2
(45) Date of Patent: Apr. 22, 2014

(54) ENCAPSULATION STRUCTURE FOR SILICON PRESSURE SENSOR

(76) Inventor: Jingxun Zhou, Jiangsu (CN)

( * ) Notice: Subject to any disclaimer, the term of this patent is extended or adjusted under 35 U.S.C. 154(b) by 0 days.

(21) Appl. No.: 13/641,870

(22) PCT Filed: Jan. 24, 2011

(86) PCT No.: PCT/CN2011/070528
§ 371 (c)(1),
(2), (4) Date: Oct. 18, 2012

(87) PCT Pub. No.: WO2011/131045
PCT Pub. Date: Oct. 27, 2011

(65) Prior Publication Data
US 2013/0069181 A1 Mar. 21, 2013

(30) Foreign Application Priority Data
Apr. 21, 2010 (CN) .......................... 2010 1 0156192

(51) Int. Cl.
*G01P 15/08* (2006.01)

(52) U.S. Cl.
USPC .................................. 257/417; 257/E29.324

(58) Field of Classification Search
USPC .................................. 257/417, 698, E29.324
See application file for complete search history.

(56) References Cited

U.S. PATENT DOCUMENTS

2013/0069181 A1* 3/2013 Zhou ............................ 257/417

FOREIGN PATENT DOCUMENTS

| CN | 1839299 A | 9/2006 |
| CN | 101271029 A | 9/2008 |
| CN | 101657709 A | 2/2010 |

* cited by examiner

*Primary Examiner* — Mark Prenty
(74) *Attorney, Agent, or Firm* — George G. Wang; Bei & Ocean

(57) ABSTRACT

An encapsulation structure for silicon pressure sensor including a case and a stem is proposed. The case and the stem are connected with a cavity therebetween. A sealing pad and a pressure sensitive silicon chip are provided in the said cavity. The sealing pad is placed under the silicon chip and the silicon chip is connected to the external circuit through the bonding pad. This invention, with the anti-overloading ability, simplifies the encapsulation structure and manufacturing process which greatly reduces the cost of material and process.

8 Claims, 8 Drawing Sheets

US 8,704,318 B2

ENCAPSULATION STRUCTURE FOR SILICON PRESSURE SENSOR

FILED OF THE INVENTION

This invention relates to an encapsulation structure for pressure sensors, and more particularly for silicon pressure sensor.

BACKGROUND OF THE INVENTION

Pressure sensors are normally applied to and set in the place where pressure change needs to be tested and responded, such as automobiles, aerospace, commerce, and other industries.

The sensing component, made by silicon MEMS (short for "Micro-electromechanical Systems") technology, is the core of a pressure sensor. The encapsulation structure for sensing components has an important effect on the performance of pressure sensors. In the prior art technique, the encapsulation structure for sensing components which is applied in the medium like corrosive gas or liquid is shown in FIG. 1. First, silicon chip 107, the sensing component, which is processed by MEMS technology, is bonded to glass base 108, and the two are together adhered to the inner space of case 109. Second, wiring terminals 102 are sintered into the terminal holes of case 109 with glass powder 103. Then, weld the bonding pad of silicon chip 107 and one end of terminals 102 together with golden wire, and the other end of terminals 102 is welded to PCB 101. Fill the inner space of case 109 with silicon oil 105, and at last, weld corrugated diaphragm 106.

In case of this kind of encapsulation structure, once the corrosive medium contacts corrugated diaphragm 10, the pressure will transfer to silicon chip 107 through silicon oil 105 so as to prevent corrosion when the pressure is being transferred. However, as for this kind of encapsulation, the structure and manufacturing process is complicated and the cost is high. So it can't meet the needs of batch production and application of silicon pressure sensors.

SUMMARY OF THE INVENTION

The present invention has been made in view of the above-mentioned problem. Therefore, after research and improvement, the applicant provides a new type of encapsulation structure for silicon pressure sensors with the anti-overloading ability to simplify the structure and manufacturing process and reduce the material and process cost greatly.

Embodiments of the present invention will now be described as follows:

An encapsulation structure for silicon pressure sensor including a case and a stem is proposed. The case and the stem are connected with a cavity therebetween. A sealing pad and a pressure sensitive silicon chip are provided in the said cavity. The sealing pad is placed under the silicon chip and the bonding pad of the silicon chip is connected to the external circuit through the case.

First embodiment: The case exhibits through holes in the corresponding position of the bonding pad of the silicon chip, and the said through holes are filled with conductive adhesive.

Second embodiment: The case exhibits through holes in the corresponding position of the bonding pad of the silicon chip, and the wall and the upper and bottom edge of said through holes are coated with conductive layer.

Third embodiment: The case exhibits through holes in the corresponding position of the bonding pad of the silicon chip, and the wall and the upper and bottom edge of the through holes are coated with conductive layer and the through holes are filled with conductive adhesive (205).

Fourth embodiment: The case has through wires in it, and the bonding pad of the silicon chip is connected to the through wires.

Further, the case has circuit on top of it, and the circuit is electronically connected to signal conditioning chip.

Further, there is backup washer between the top of pressure sensitive silicon chip and the bottom of the case. The backup washer is placed on the top of silicon chip or the bottom of case and on the periphery of the central strain zone of silicon chip.

Further, sealing pad is made of flexible material.

Technical benefits of this invention:

(1) The bonding technique is eliminated and there is no silicon oil or convoluted diaphragm for separation, so this invention simplifies the encapsulation structure and manufacturing process which greatly reduces the cost of material and process.

(2) The circuit forms on the top of the case with the function of PCB substrate and is electrically connected to signal conditioning chip. Thus it is more convenient to make pressure transferring modules with standard signal output.

(b 3) The sealing pad is made of flexible material which keeps the pressure sensing chip floating in the ceramic space so as to protect from rigid encapsulation stress.

(4) There is backup washer with certain thickness on top of pressure sensing chip or at the bottom of the case so as to protect the pressure sensing chip from being destroyed. Meanwhile the sensing chip can resist more than ten times of pressure overloading and so has the overloading ability.

Figure 6:
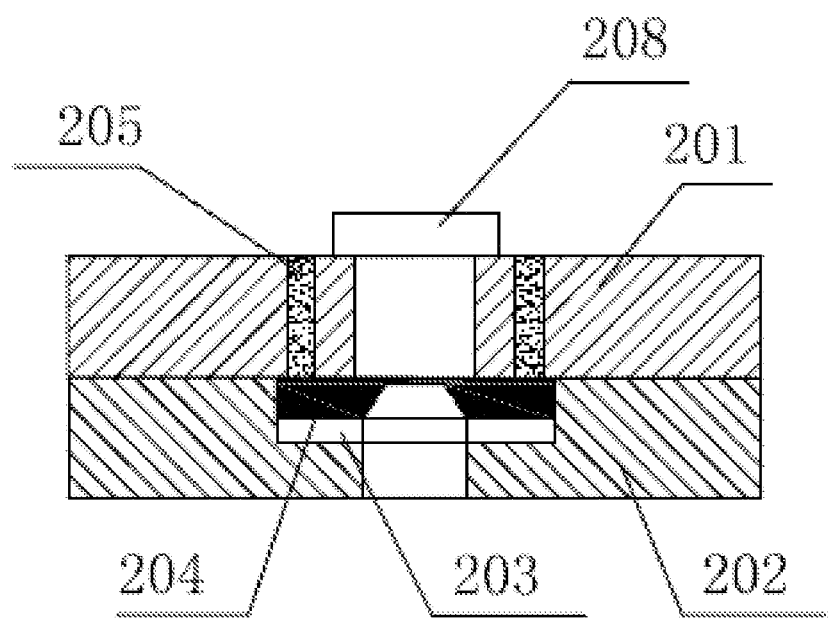
FIG. 6 is a schematic sectional view of the fifth embodiment.
Figure 7:
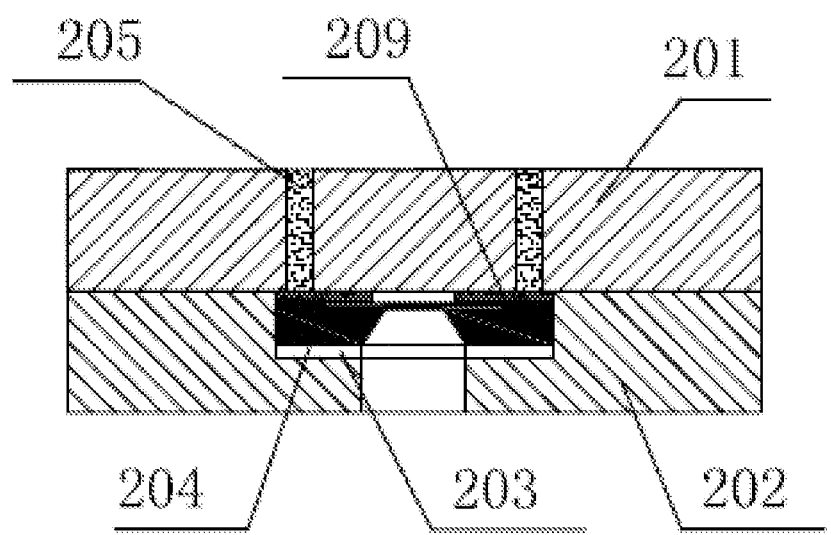
FIG. 7 is a schematic sectional view of the sixth embodiment.
Figure 8:
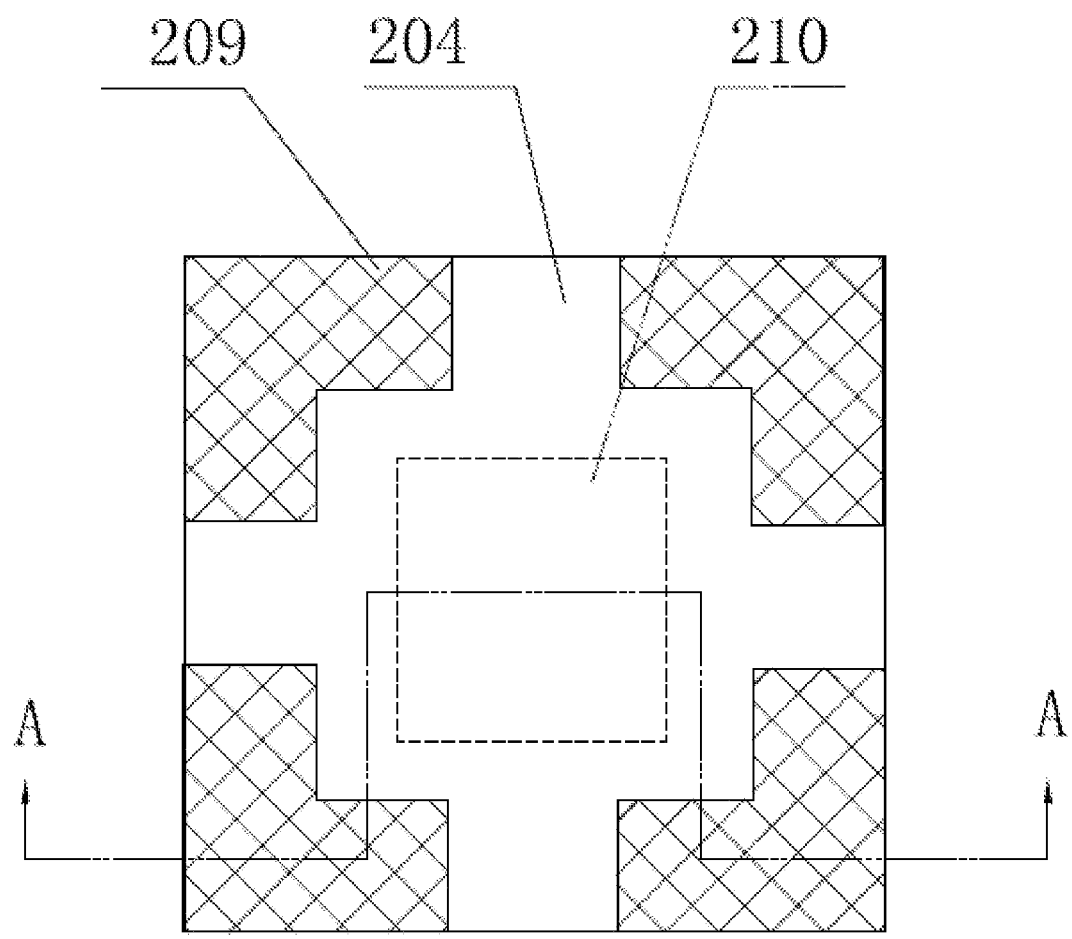
FIG. 8 is an enlarged view of backup washer's shape and location which is overlooked from top the pressure sensing chip.

It is noted that FIGS. 2-7 are sectional views taken along a line A-A of FIG. 8.

DETAILED DESCRIPTION OF PARTICULAR EMBODIMENTS OF THE INVENTION

With reference to the accompanying drawings, the embodiments will now be described to illustrate the invention.

Figure 1:
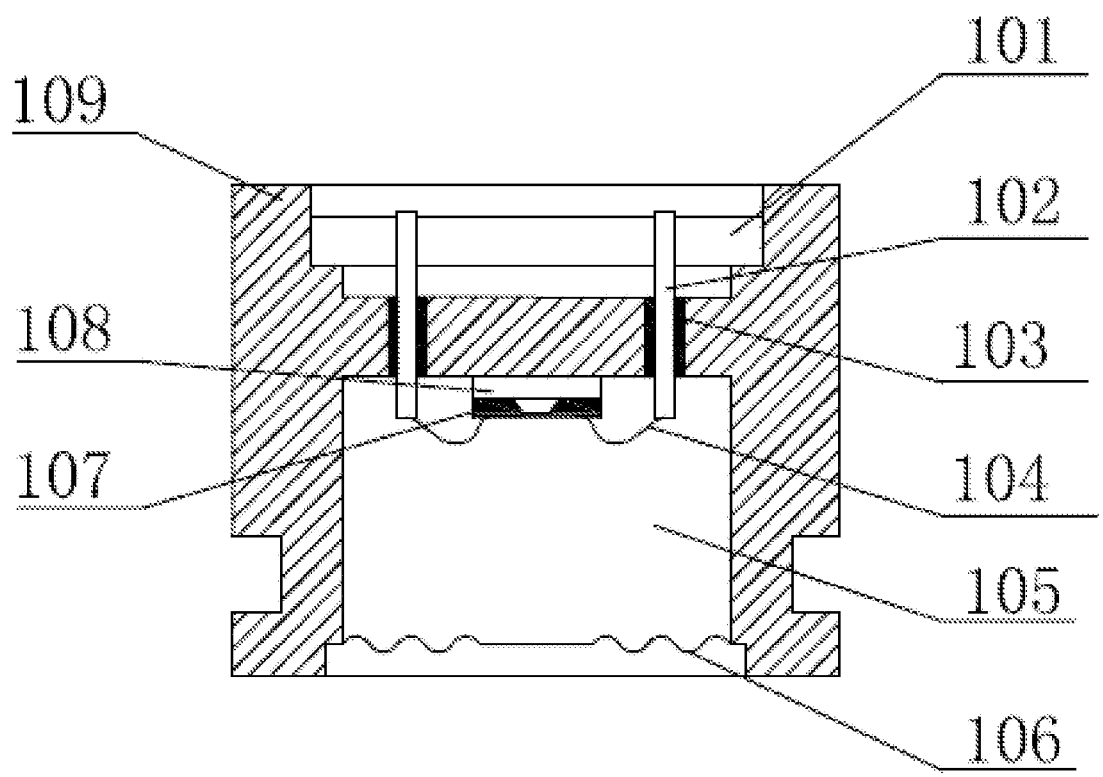
FIG. 1 is a schematic sectional view of an encapsulation structure for silicon pressure sensors.
Figure 2:
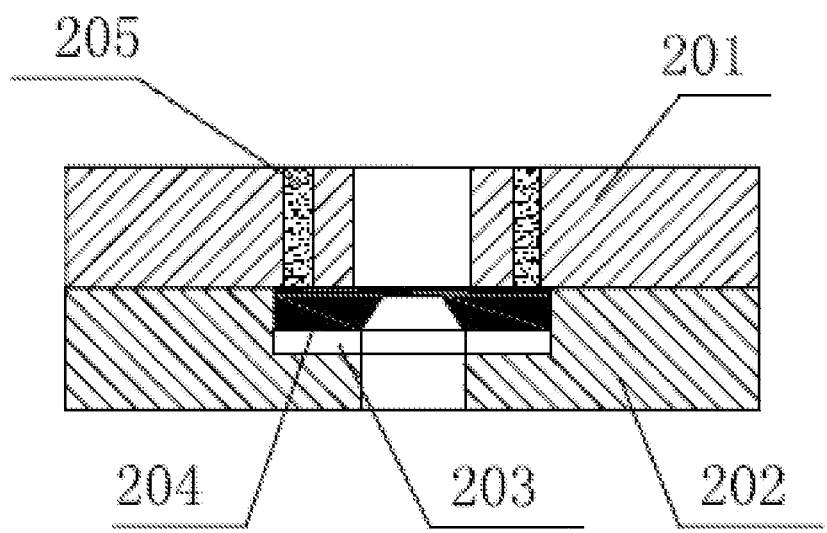
FIG. 2 is a schematic sectional view of the first embodiment.

First Embodiment:

FIG. 2 is a schematic diagram for the first embodiment. Referring to FIG. 2, case 201 and stem 202 are bonded together as a carrier, and form a cavity therebetween. Sealing pad 203 and pressure sensing chip 204 are placed in the cavity with sealing pad 203 beneath the pressure sensing chip 204. The bonding pad of pressure sensing chip 204 is connected to the external circuit through case 201. One preferred option is that, case 201 has through holes in the corresponding position of the bonding pad of pressure sensing chip 204. The through holes are filled with conductive adhesive 205 so as to transfer the signal of the bonding pad to the top the case 201 which is connected to the exterior circuits. In this embodiment, sealing pad 203 is made of flexible material (e.g. rubber) which keeps pressure sensing chip 204 floating in the cavity so as to protect it from rigid encapsulation stress.

Figure 3:
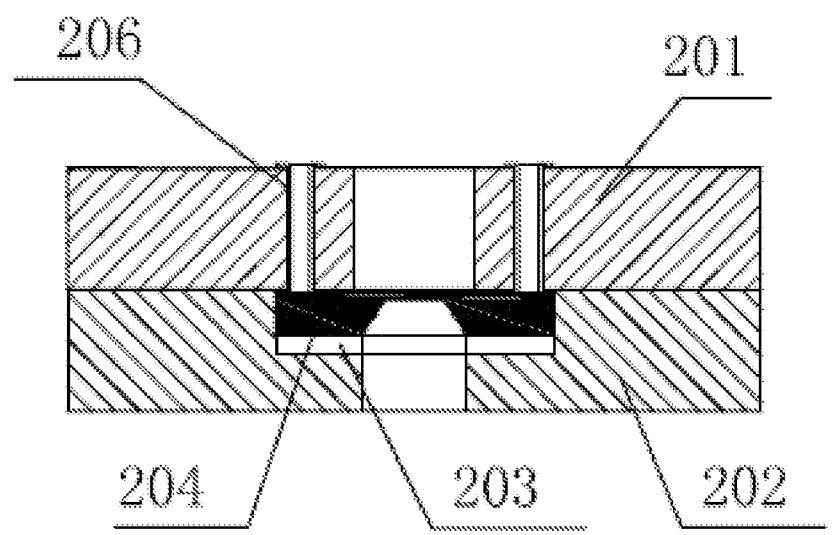
FIG. 3 is a schematic sectional view of the second embodiment.

Second Embodiment:

As one further preferred option as shown in FIG. 3, case 201 has through holes in the corresponding position of the bonding pad of case 204. The through holes are coated with conductive layer 206 on their walls and upper and bottom edge. Then the signal of the bonding pad is transferred to the top the case 201 which is connected to the exterior circuits.

Figure 4:
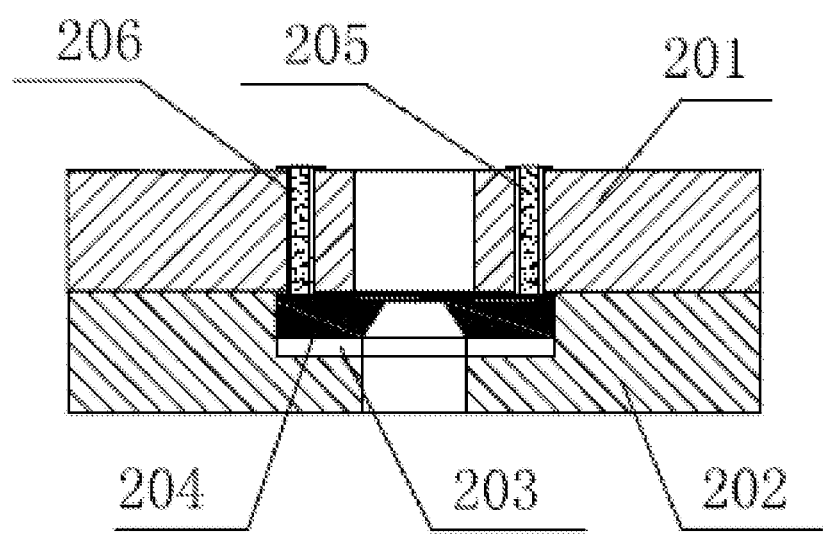
FIG. 4 is a schematic sectional view of the third embodiment.

Third Embodiment:

As one further preferred option as shown in FIG. 4, case 201 has through holes in the corresponding position of the bonding pad of case 204. The holes are coated with conductive layer 206 on their walls and upper and bottom edge, and they are filled with conductive adhesive 205. Then the signal of the bonding pad is transferred to the top of case 201 which is connected to the exterior circuits through conductive layer 206 and conductive adhesive 205.

Figure 5:
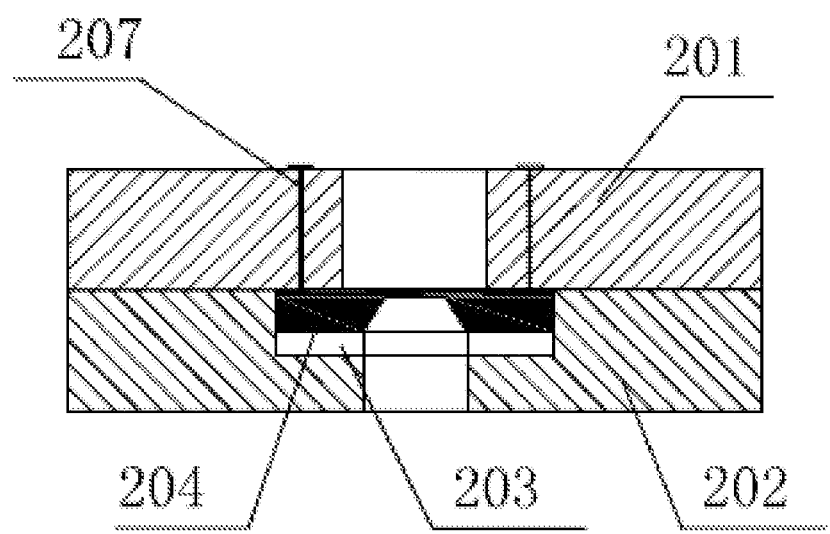
FIG. 5 is a schematic sectional view of the fourth embodiment.

Fourth Embodiment:

As one further preferred option as shown in FIG. 5, case 201 has through wires 207 in it which are connected to conducting strips on their both ends. The bonding pad of pressure sensing chip 204 is connected to one of the conducting strips and then the signal of the bonding pad is transferred to the top of case 201 which is connected to the exterior circuits through conducting strips and wires 207.

On the basis of the four above-mentioned embodiments, there can be further embodiments as follows.

Fifth Embodiment:

As one further preferred option, as shown in FIG. 6, it forms circuits on top of case 201 by thick-film or thin-film process. Meanwhile, it has the function as PCB substrate which is electrically connected to signal conditioning chip 208. Thus it is the encapsulation structure for silicon pressure sensors with standard signal output.

Sixth Embodiment:

As one further preferred option as shown in FIGS. 7 and 8, there is backup washer 209 between the top of pressure sensitive silicon chip 204 and the bottom of the case 201. The backup washer is placed on the top of silicon chip 204 or the bottom of case 201 or both, and meanwhile on the periphery of the central strain zone 210 of silicon chip 204. The shape and position of the backup washer 209 can be optional in accordance with design requirements as long as the support effect can be assured. For example, backup washer 209 can be placed on the four corners of the top of pressure sensing chips 204, and so backup washer 209 can be meanwhile the bonding pad of pressure sensing chip 204. Backup washer 209 can be directly adhered to the top of pressure sensing chip 204 or the bottom of case 201 by the existing thick-film and thin-film technology. Because of the backup washer 209 here, case 201 in FIG. 7 can have no through holes in the corresponding position of the top of the sensing chip 204 as shown from FIG. 2 to FIG. 6.

Backup washer 209 can form a certain gap between the central strain area 210 of the pressure sensing chip 204 and the bottom surface of case 201 which is larger than the vertical deformation of pressure sensing chip 204 when nominal pressure is applied. When pressure is overloaded which causes the removal of the gap, it can restrict the further deformation of the strain area 210 of the sensing chip 204 and thus protect it from destruction, which can withstand more than ten times of overloading pressure.

Although the invention has been described above, the invention is not limited to the above detailed embodiments. The scope of the invention is defined with reference to the claims, including modifications and variations in light of the concept of the invention.

What is claimed is:

1. An encapsulation structure for silicon pressure sensor, comprising a case, a stem, a sealing pad and a pressure sensitive silicon chip, wherein said case and said stem are connected to each other and define a cavity therebetween in which said sealing pad and said pressure sensitive silicon chip are disposed, said sealing pad is placed underneath said silicon chip which comprises a bonding pad, said stem has a plurality of channels, the said sealing pad has a plurality of through holes, and said bonding pad of said silicon chip is connected to an external circuit via a conductor in a through hole inside said case.

2. The encapsulation structure for silicon pressure sensor according to claim 1, wherein said case comprises a plurality of through holes in a position corresponding to a plurality of bonding pads of said silicon chip, and said plurality of through holes are filled with conductive adhesive.

3. The encapsulation structure for silicon pressure sensor according to claim 1, wherein said case comprises a plurality of through holes in a position corresponding to a plurality of bonding pads of said silicon chip, said through holes each comprise a wall, an upper edge, and bottom edge, and said wall, upper edge and bottom edge are coated with a conductive layer.

4. The encapsulation structure for silicon pressure sensor according to claim 3, wherein said through holes are each filled with conductive adhesive.

5. The encapsulation structure for silicon pressure sensor according to claim 1, wherein said case comprises a plurality of through wires, and said bonding pad of said silicon chip is connected to one of said plurality of through wires.

6. The encapsulation structure for silicon pressure sensor according to claim 1, further comprising a circuit positioned on top of said case and said circuit is electronically connected to a signal conditioning chip.

7. The encapsulation structure for silicon pressure sensor according to claim 1, further comprising a backup washer between the top of said pressure sensitive silicon chip and the bottom of said case and at a periphery of a central strain zone of said pressure sensitive silicon chip, wherein said backup washer is either placed on the top of said silicon chip or placed on the bottom of said case.

8. The encapsulation structure for silicon pressure sensor according to claim 1, wherein said sealing pad is made of a flexible material.

* * * * *